United States Patent
Tu et al.

(10) Patent No.: US 7,696,646 B2
(45) Date of Patent: Apr. 13, 2010

(54) POWER SWITCHING CIRCUIT FOR LIQUID CRYSTAL DISPLAY

(75) Inventors: Jia-Hui Tu, Shenzhen (CN); Tong Zhou, Shenzhen (CN)

(73) Assignees: Innocom Technology (Shenzhen) Co., Ltd., Shenzhen, Guangdong Province (CN); Innolux Display Corp., Miao-Li County (TW)

( * ) Notice: Subject to any disclaimer, the term of this patent is extended or adjusted under 35 U.S.C. 154(b) by 261 days.

(21) Appl. No.: 12/011,715

(22) Filed: Jan. 28, 2008

(65) Prior Publication Data

US 2008/0180870 A1 Jul. 31, 2008

(30) Foreign Application Priority Data

Jan. 29, 2007 (TW) .............................. 96103210 A

(51) Int. Cl.
*H01H 89/00* (2006.01)
*H02H 9/00* (2006.01)

(52) U.S. Cl. ...................... 307/113; 307/112; 307/116; 307/125; 307/130; 307/135; 307/139; 307/140; 307/141

(58) Field of Classification Search ......... 307/112–113, 307/116, 125, 130, 135, 139–141
See application file for complete search history.

(56) References Cited

U.S. PATENT DOCUMENTS

| | | | | |
|---|---|---|---|---|
| 4,331,977 A * | 5/1982 | Cohn et al. | ................. | 348/725 |
| 4,945,444 A * | 7/1990 | Schwertlein et al. | ........ | 361/101 |
| 5,155,648 A * | 10/1992 | Gauthier | ...................... | 361/58 |
| 5,283,707 A * | 2/1994 | Conners et al. | ............... | 361/58 |
| 5,465,400 A * | 11/1995 | Norimatsu | ................... | 455/76 |
| 5,951,660 A * | 9/1999 | Van Wonterghem | ......... | 710/302 |
| 6,256,182 B1 | 7/2001 | Suzuki | | |
| 6,295,212 B1 * | 9/2001 | Kayser et al. | ................. | 363/19 |
| 6,335,654 B1 * | 1/2002 | Cole | ......................... | 327/546 |
| 6,411,068 B1 * | 6/2002 | Willis | ......................... | 323/282 |
| 6,807,039 B2 * | 10/2004 | Priest | ........................ | 361/93.1 |
| 6,816,348 B2 * | 11/2004 | Chen et al. | .................... | 361/56 |
| 7,068,109 B2 * | 6/2006 | Woodford | ................... | 330/297 |
| 7,098,633 B1 * | 8/2006 | Brokaw et al. | .............. | 323/222 |
| 7,330,003 B2 * | 2/2008 | Zhou et al. | ................... | 315/318 |
| 7,355,368 B2 * | 4/2008 | Salato et al. | ................ | 323/222 |
| 7,535,691 B2 * | 5/2009 | Mayell | ...................... | 361/93.1 |
| 7,580,234 B2 * | 8/2009 | Tamosaitis | ................. | 361/93.9 |
| 7,586,727 B2 * | 9/2009 | Yamashita | ................. | 361/93.9 |
| 2007/0114944 A1 * | 5/2007 | Jang et al. | ..................... | 315/60 |
| 2008/0001942 A1 * | 1/2008 | Tu et al. | ..................... | 345/211 |

* cited by examiner

*Primary Examiner*—Stephen W Jackson
*Assistant Examiner*—Adi Amrany
(74) *Attorney, Agent, or Firm*—Wei Te Chung

(57) ABSTRACT

An exemplary power switching circuit (20) includes a control signal input terminal (210); an output terminal (220); direct current (DC) power supply (230); a first transistor (250) including a control electrode connected to the control signal input terminal, a first current conducting electrode, and a grounded second current conducting electrode; a second transistor (260) including a control electrode connected to first current conducting electrode of the first transistor via a discharging resistor (264) and a diode (266) respectively and connected to the DC power supply via a discharging capacitor (265), a first current conducting electrode connected to the DC power supply, and a second current conducting electrode connected to the output terminal; and a third transistor (270) including a control electrode connected to first current conducting electrode of the first transistor, a first current conducting electrode connected to the output terminal, and a second grounded current conducting electrode.

17 Claims, 3 Drawing Sheets

POWER SWITCHING CIRCUIT FOR LIQUID CRYSTAL DISPLAY

FIELD OF THE INVENTION

The present invention relates to power switching circuits for liquid crystal displays (LCDs), and particularly to a power switching circuit employing one direct current (DC) power supply.

GENERAL BACKGROUND

An LCD has the advantages of portability, low power consumption, and low radiation, and has been widely used in various portable information products such as notebooks, personal digital assistants (PDAs), video cameras and the like. Furthermore, the LCD is considered by many to have the potential to completely replace CRT (cathode ray tube) monitors and televisions.

A typical LCD includes an LCD panel. The LCD panel includes a multiplicity of pixels, each having a capacitance. When a power supply provides an operation voltage to the LCD and then the power supply is turned off, the operation voltage does not immediately decrease. For example, when a power supply voltage of 5V is turned off, a decrease to a residual voltage 0.4 V takes about 20 seconds. If the power supply is turned on again quickly before the residual voltage in the power supply has decreased to a predetermined voltage, this causes an operational error in the LCD. To prevent such operational error, a power switching circuit is provided in the LCD to remove the residual voltage.

FIG. 3 is a circuit diagram of a typical power switching circuit 10 used in an LCD. The power switching circuit 10 includes a control signal input terminal 110 which is configured for receiving control signals, an output terminal 120 connected to the LCD, a twelve volt direct current (DC) power supply 130, a five volt DC power supply 140 functioning as a main power source of the LCD, a first negative-positive-negative (NPN) transistor 150, a second NPN transistor 170, an n-channel enhancement mode metal-oxide-semiconductor (NMOS) transistor 160, a first resistor 155, a second resistor 156, a third resistor 165, a fourth resistor 175, and a fifth resistor 176.

The first NPN transistor 150 includes a base electrode "b" connected to the control signal input terminal 110 via the first resistor 155, an emitter electrode "e" connected to the base electrode "b" via the second resistor 156 and further connected to ground, and a collector electrode "c" connected to the 12V DC power supply 130 via the third resistor 165.

The second NPN transistor 170 includes a base electrode "b" connected to the control signal input terminal 110 via the fourth resistor 175, an emitter electrode "e" connected to ground, and a collector electrode "c" connected to the output terminal 120 via the fifth resistor 176.

The NMOS transistor 160 includes a gate electrode "G" connected to the collector electrode "c" of the first NPN transistor 150, a source electrode "S" connected to the output terminal 120, and a drain electrode "D" connected to the 5V DC power supply 140.

In order to apply a 5V voltage from the 5V DC power supply 140 to the output terminal 120, a first control signal such as a low level 0V voltage is provided to the control signal input terminal 110 by an external circuit (not shown). Thus the first NPN transistor 150 and the second NPN transistor 170 are switched off. A 12V voltage from the 12V DC power supply 130 is applied to the gate electrode "G" of the NMOS transistor 160 via the third resistor 165. Thus the NMOS transistor 160 is switched on, and the 5V voltage from the 5V DC power supply 140 is applied to the output terminal 120 via the activated NMOS transistor 160.

In order to suspend the supply of the 5V voltage from the 5V DC power supply 140 to the output terminal 120, a second control signal such as a high level 5V voltage is provided to the control signal input terminal 110 by the external circuit. Thus the first NPN transistor 150 and the second NPN transistor 170 are switched on. The gate electrode "G" of the NMOS transistor 160 is connected to ground via the activated first NPN transistor 150, so that the NMOS transistor 160 is switched off. Thus, the 5V voltage from the 5V DC power supply 140 cannot be provided to the output terminal 120. Electric charges stored in the LCD which is connected to the output terminal 120 can be discharged quickly through the actived second NPN transistor 170.

Referring to FIG. 4, a current wave diagram of the power switching circuit 10 is shown. When the NMOS transistor 160 is switched on, and the supply of the 5V voltage is provided to the LCD via the activated NMOS transistor 160, a five amperes rush current is generated at the moment that the NMOS transistor 160 is switched on. The rush current may accelerate an aging process of electronic devices of the LCD. Thus a service life of the LCD is reduced.

It is desired to provide a new power switching circuit used in an LCD which can overcome the above-described deficiencies.

SUMMARY

In one preferred embodiment, a power switching circuit includes a control signal input terminal configured for receiving a control signal; an output terminal configured to be connected to a load circuit; a direct current (DC) power supply; a first transistor including a control electrode connected to the control signal input terminal, a first current conducting electrode, and a second current conducting electrode connected to ground; a second transistor including a control electrode connected to the first current conducting electrode of the first transistor via a discharging resistor and a diode respectively and connected to the DC power supply via a discharging capacitor, a first current conducting electrode connected to the DC power supply, and a second current conducting electrode connected to the output terminal; and a third transistor including a control electrode connected to first current conducting electrode of the first transistor, a first current conducting electrode connected to the output terminal, and a second current conducting electrode connected to ground.

Other novel features and advantages will become more apparent from the following detailed description when taken in conjunction with the accompanying drawings.

DETAILED DESCRIPTION OF PREFERRED EMBODIMENTS

Reference will now be made to the drawings to describe the present invention in detail.

Figure 1:
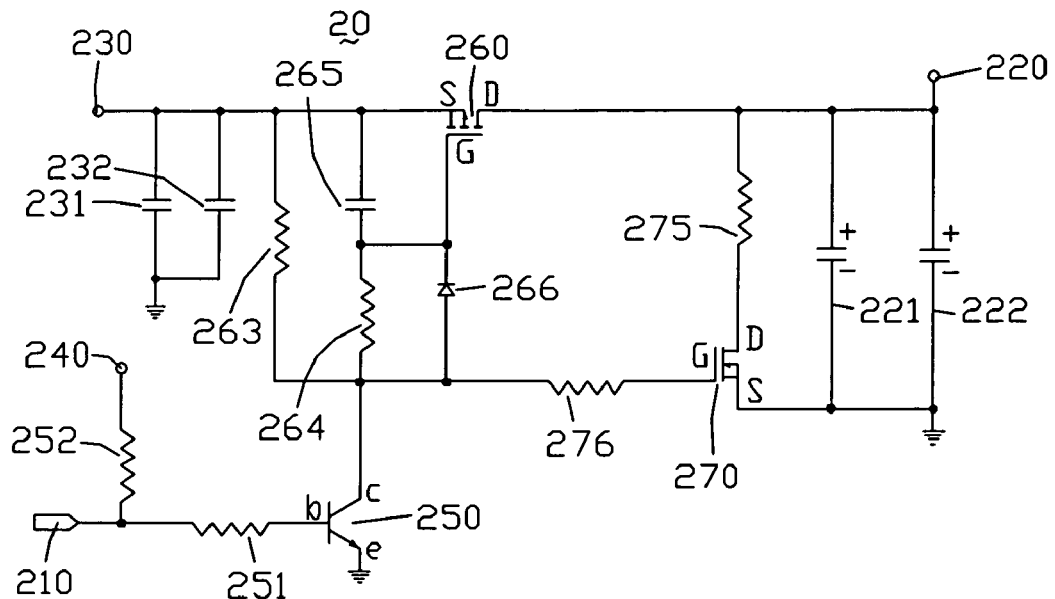
FIG. 1 is a circuit diagram of a power switching circuit according to a preferred embodiment of the present invention, the power switching circuit being typically used in an LCD.

FIG. 1 is a current diagram of a power switching circuit 20 according to an exemplary embodiment of the present invention, the power switching circuit 20 being typically used in an LCD. The power switching circuit 20 includes a control signal input terminal 210 which is configured for receiving a control signal, an output terminal 220 configured for connecting to a load circuit (not shown) such as an LCD, a 3.3V DC power supply 240, a 5V DC power supply 230 functioning as a main power source of the load circuit, an NPN transistor 250, a p-channel enhancement mode metal-oxide-semiconductor (PMOS) transistor 260, a n-channel enhancement mode metal-oxide-semiconductor (NMOS) transistor 270, a first current limiting resistor 251, a second current limiting resistor 276, a first bias resistor 252, a second bias resistor 263, a third bias resistor 275, a discharge resistor 264, a charging capacitor 265, a diode 266, a first filter capacitor 221, a second filter capacitor 222, a third capacitor 231, and a fourth capacitor 232.

The control signal input terminal 210 is connected to the 3.3V DC power supply 240 via the first bias resistor 252.

A base electrode "b" of the NPN transistor 250 is connected to the control signal input terminal 210 via the first current limiting resistor 251. An emitter electrode "e" of the NPN transistor 250 is connected to ground. A collector electrode "c" of the NPN transistor 250 is connected to the five volt DC power supply 230 via the second bias resistor 263, and is further connected to a gate electrode "G" of the PMOS transistor 260 via the discharging resistor 264 and the diode 266 respectively. A positive terminal of the diode 266 is connected to the collector electrode "c" of the NPN transistor 250.

The charging capacitor 265 is connected between the gate electrode "G" and source electrode "S" of the PMOS transistor 260. The source electrode "S" of the PMOS transistor 260 is connected to the 5V DC power supply 230. A drain electrode "D" of the PMOS transistor 260 is connected to the output terminal 220.

A gate electrode "G" of the NMOS transistor 270 is connected to the collector electrode "c" of the NPN transistor 250 via the second current limiting resistor 276. A source electrode "S" of the NMOS transistor 270 is connected to ground. A drain electrode "D" of the NMOS transistor 270 is connected to the output terminal 220 via the third bias resistor 275.

The first filter capacitor 221 and the second filter capacitor 222 are connected between the output terminal 220 and ground, respectively. The third filter capacitor 231 and the fourth capacitor are connected between the 5V power supply 230 and ground, respectively.

Figure 2:
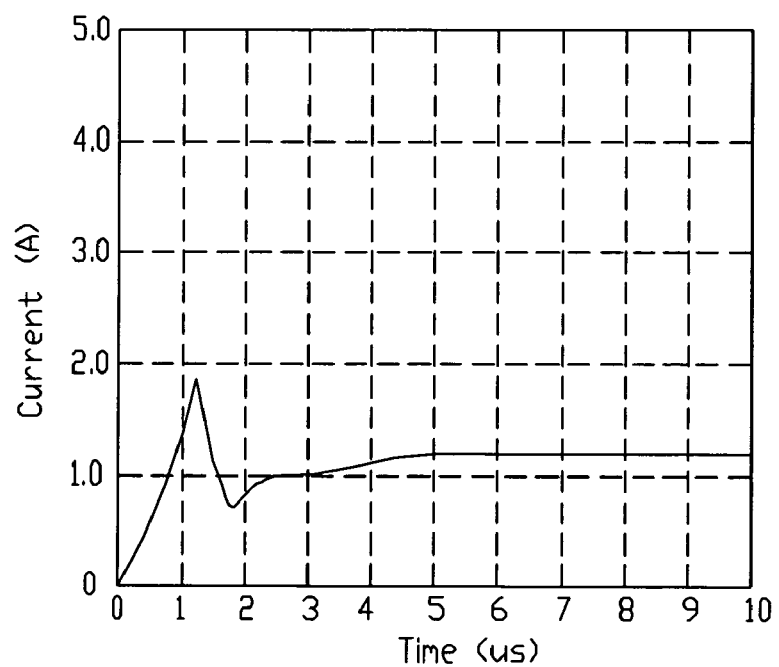
FIG. 2 is a current wave diagram of the power switching circuit of FIG. 1.
Figure 3:
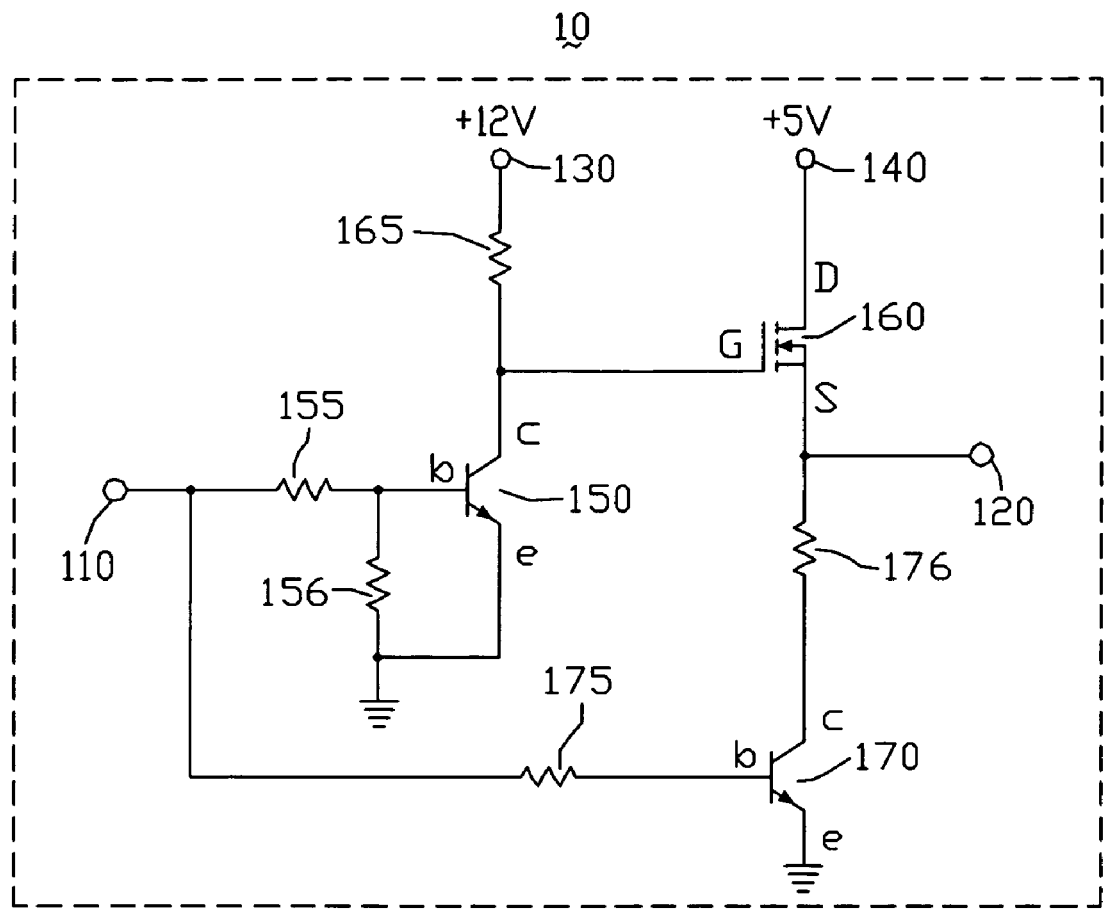
FIG. 3 is a circuit diagram of a conventional power switching circuit used in an LCD.
Figure 4:
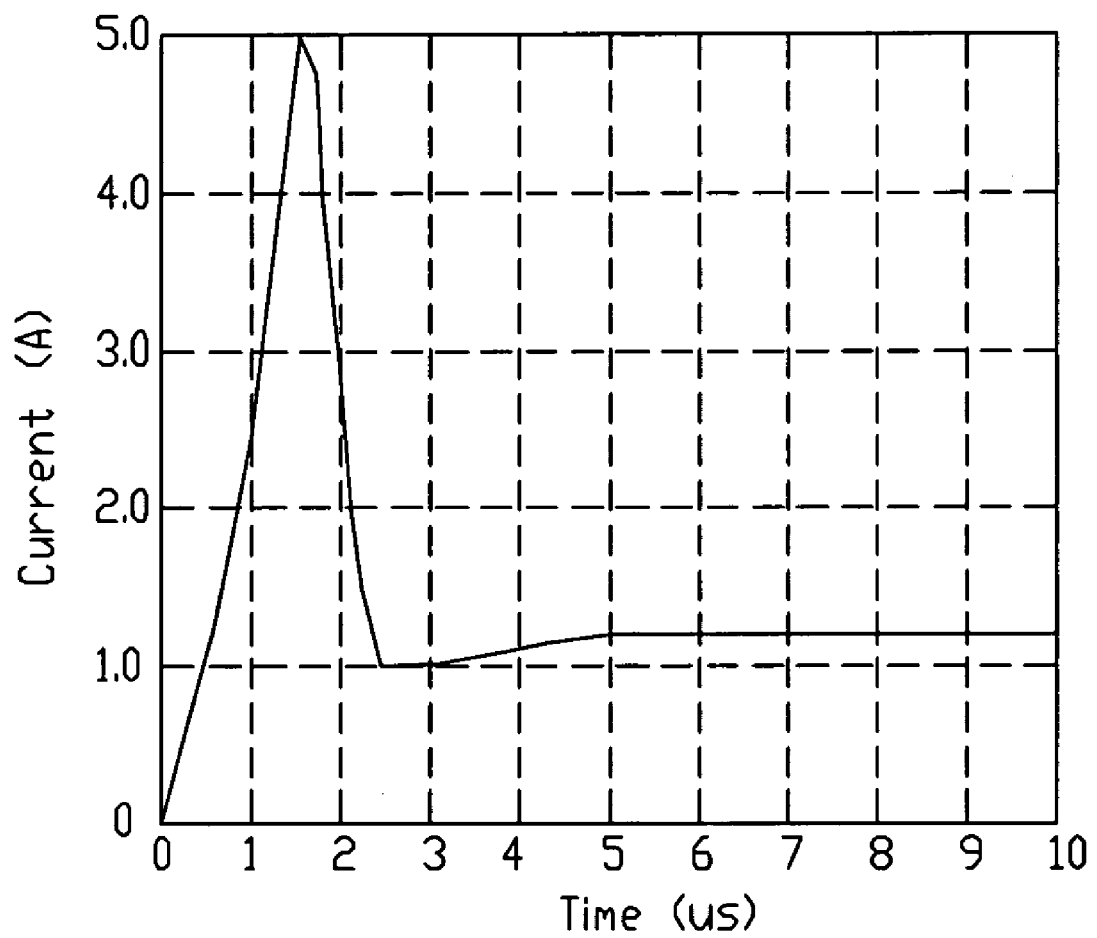
FIG. 4 is a current wave diagram of the power switching circuit of FIG. 3.

In order to apply the 5V voltage from the DC power supply 230 to the output terminal 220, a first control signal such as a high level 5V voltage is provided to the control signal input terminal 210 by an external circuit (not shown). Thus the NPN transistor 250 is switched on and electric charges stored in the charging capacitor 265 are discharged to ground through the discharging resistor 264 and the activated NPN transistor 250 in series. Thus a voltage of the gate electrode "G" of the PMOS transistor 260 is slowly decreased to zero volts. A voltage difference between the gate electrode "G" and the source electrode "S" of the PMOS transistor 260 is slowly increased to approximately 5V, thus a channel of the PMOS transistor 260 is slowly open, and a current flows through the channel of the PMOS transistor is gradually increased. Accordingly, the 5V voltage from the DC power supply 230 is provided to the output terminal 220 via the PMOS transistor 260 without large current. Referring to FIG. 2, a current wave diagram of the power switching circuit 20 is shown. When the supply of the 5V voltage is gradually provided to the LCD via the PMOS transistor 260, a two amperes rush current is generated at the moment that the NMOS transistor 160 is switched on. At the same time, the gate electrode "G" of the NMOS transistor 270 is connected to ground via the second current limiting resistor 276 and the activated PMOS transistor 260. Thus the NMOS transistor 270 is switched off.

In order to suspend the supply of the 5V voltage from the DC power supply 230 to the output terminal 220, a second control signal such as a low level 0V voltage is provided to the control signal input terminal 210 by the external circuit. Thus the NPN transistor 250 is switched off. The 5V voltage of the DC power supply 230 is provided to the gate electrode "G" of the PMOS transistor 260 via the second bias resistor 263 and the diode 266 for quickly charging the charging capacitor 265. The voltage difference between the gate electrode "G" and the source electrode "S" of the PMOS transistor 260 is quickly decreased to 0V. Thus the channel of the PMOS transistor 260 is quickly pinched off and the PMOS transistor 260 is switched off. Therefore, the 5V voltage from the DC power supply 230 cannot be provided to the output terminal 220. At the same time, 5V voltage from the DC power supply 230 is provided to the gate electrode "G" of the NMOS transistor 270 for switching on the NMOS transistor 270. Electric charges stored in the load circuit which is connected to the output terminal 220 can be quickly discharged through the actived NMOS transistor 270.

Because the power switching circuit 20 includes the charging capacitor 265, the second bias resistor 263, the diode 266, and the charging resistor 264, the power switching circuit 20 can prevent a channel of the PMOS transistor 260 from being opened too quickly. Thus a rush current of a load circuit which is generated when a 5V voltage from the five volt DC power supply 230 is applied to an output terminal 220 can be reduced to only two amperes. Thus a service life of the load circuit such as LCD is increased.

In various alternative embodiments, each of the NPN transistors 250 can be replaced by an NMOS transistor, the PMOS transistor 260 can be replaced by a PNP transistor, and each of the NMOS transistors 270 can be replaced by an NPN transistor.

It is to be further understood that even though numerous characteristics and advantages of preferred and exemplary embodiments have been set out in the foregoing description, together with details of the structures and functions of the embodiments, the disclosure is illustrative only; and that changes may be made in detail, especially in matters of arrangement of parts within the principles of present invention to the full extent indicated by the broad general meaning of the terms in which the appended claims are expressed.

What is claimed is:

1. A power switching circuit comprising:
 a control signal input terminal configured for receiving a control signal;
 an output terminal configured to be connected to a load circuit;
 a direct current (DC) power supply;

a first transistor comprising a control electrode connected to the control signal input terminal, a first current conducting electrode, and a second current conducting electrode connected to ground;

a second transistor comprising a control electrode connected to the first current conducting electrode of the first transistor via a discharging resistor and a diode and further connected to the DC power supply via a discharging capacitor, a first current conducting electrode connected to the DC power supply, and a second current conducting electrode connected to the output terminal; and a third transistor comprising a control electrode connected to the first current conducting electrode of the first transistor, a first current conducting electrode connected to the output terminal, and a second current conducting electrode connected to ground.

2. The power switching circuit as claimed in claim 1, further comprising a first current limiting resistor connected between the control electrode of the first transistor and the control signal input terminal.

3. The power switching circuit as claimed in claim 1, further comprising a 3.3V DC power supply, and a first bias resistor connected between control signal input terminal and the 3.3V DC power supply.

4. The power switching circuit as claimed in claim 1, further comprising at least one filter capacitor connected between the output terminal and ground.

5. The power switching circuit as claimed in claim 1, further comprising at least one filter capacitor connected between DC power supply and ground.

6. The power switching circuit as claimed in claim 5, wherein the DC power supply is a 5V DC power supply.

7. The power switching circuit as claimed in claim 1, further comprising a second bias resistor connected between the first conducting electrode of the first transistor and the DC power supply.

8. The power switching circuit as claimed in claim 1, further comprising a third bias resistor connected between the first current conducting electrode of the third transistor and the output terminal.

9. The power switching circuit as claimed in claim 1, further comprising a second current limiting resistor connected between the control electrode of the second transistor and the conducting electrode of the first transistor.

10. The power switching circuit as claimed in claim 1, wherein the control signal is a high level voltage or a low level voltage.

11. The power switching circuit as claimed in claim 1, wherein the first transistor is an n-channel enhancement mode metal-oxide-semiconductor (NMOS) transistor.

12. The power switching circuit as claimed in claim 1, wherein the first transistor is a negative-positive-negative (NPN) transistor.

13. The power switching circuit as claimed in claim 1, wherein the second transistor is a p-channel enhancement mode metal-oxide-semiconductor (PMOS) transistor.

14. The power switching circuit as claimed in claim 1, wherein the second transistor is a positive-negative-positive (PNP) transistor.

15. The power switching circuit as claimed in claim 1, wherein the third transistor is an n-channel enhancement mode metal-oxide-semiconductor (NMOS) transistor.

16. The power switching circuit as claimed in claim 1, wherein the third transistor is an negative-positive-negative (NPN) transistor.

17. The power switching circuit as claimed in claim 1, wherein the load circuit is comprised in a liquid crystal display.

* * * * *